(12) United States Patent
Van De Wal et al.

(10) Patent No.: US 9,715,182 B2
(45) Date of Patent: Jul. 25, 2017

(54) LITHOGRAPHIC APPARATUS, SUBSTRATE SUPPORT SYSTEM, DEVICE MANUFACTURING METHOD AND CONTROL PROGRAM

(71) Applicant: ASML Netherlands B.V., Veldhoven (NL)

(72) Inventors: Marinus Maria Johannes Van De Wal, Oirschot (NL); Wilhelmus Henricus Theodorus Maria Aangenent, 's-Hertogenbosch (NL); Ramidin Izair Kamidi, Eindhoven (NL); Khalid Manssouri, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 106 days.

(21) Appl. No.: 14/647,778

(22) PCT Filed: Nov. 25, 2013

(86) PCT No.: PCT/EP2013/074613
§ 371 (c)(1),
(2) Date: May 27, 2015

(87) PCT Pub. No.: WO2014/082961
PCT Pub. Date: Jun. 5, 2014

(65) Prior Publication Data
US 2015/0316860 A1    Nov. 5, 2015

Related U.S. Application Data

(60) Provisional application No. 61/730,428, filed on Nov. 27, 2012.

(51) Int. Cl.
*G03F 7/20* (2006.01)

(52) U.S. Cl.
CPC ...... *G03F 7/70725* (2013.01); *G03F 7/70341* (2013.01); *G03F 7/70758* (2013.01); *G03F 7/70783* (2013.01)

(58) Field of Classification Search
None
See application file for complete search history.

(56) References Cited

U.S. PATENT DOCUMENTS 6,213,443 B1    4/2001    Wakui
7,327,437 B2    2/2008    Cox et al.
(Continued)

FOREIGN PATENT DOCUMENTS

CN    101271282    9/2008
CN    101320223    12/2008
(Continued)

OTHER PUBLICATIONS

English translation of Japanese Office Action mailed Jul. 14, 2016 in corresponding Japanese Patent Application No. 2015-544434 (4 pages).
(Continued)

*Primary Examiner* — Steven H Whitesell Gordon
(74) *Attorney, Agent, or Firm* — Pillsbury Winthrop Shaw Pittman LLP

(57) ABSTRACT

A lithographic apparatus includes a driven object having compliant dynamics; a plurality of actuators configured to act on the driven object, wherein the plurality of actuators are over-determined in an actuator degree of freedom; a control system including a transformation matrix configured to generate controller output signals for each of the plurality of actuators in response to a setpoint, wherein the transformation matrix is configured such that the controller output signals do not excite the compliant dynamics of the driven object in at least one degree of freedom.

21 Claims, 10 Drawing Sheets

(56) References Cited

U.S. PATENT DOCUMENTS

| | | | |
|---|---|---|---|
| 7,710,540 | B2 | 5/2010 | Loopstra et al. |
| 7,742,149 | B2 | 6/2010 | De Vos et al. |
| 7,782,446 | B2 | 8/2010 | Kamidi et al. |
| 7,999,920 | B2 | 8/2011 | Ye et al. |
| 8,584,056 | B2 | 11/2013 | Chen et al. |
| 8,854,607 | B2 | 10/2014 | Kamidi et al. |
| 9,052,614 | B2 * | 6/2015 | Nawata .................. G03F 7/709 |
| 9,188,878 | B2 * | 11/2015 | Fujimoto ............ G03F 7/70725 |
| 2008/0212054 | A1 * | 9/2008 | Kamidi ............... G03F 7/70725 355/53 |
| 2008/0246936 | A1 * | 10/2008 | Loopstra ............ G03F 7/70725 355/53 |
| 2008/0309911 | A1 | 12/2008 | De Vos et al. |
| 2009/0053628 | A1 | 2/2009 | Ye et al. |
| 2010/0195085 | A1 | 8/2010 | Fuse |
| 2011/0164230 | A1 * | 7/2011 | Ito ....................... G03F 7/70725 355/53 |
| 2011/0230999 | A1 | 9/2011 | Chen et al. |
| 2012/0127449 | A1 * | 5/2012 | Kamidi ............... G03F 7/70725 355/72 |

FOREIGN PATENT DOCUMENTS

| | | |
|---|---|---|
| CN | 101373338 | 2/2009 |
| CN | 102540756 | 7/2012 |
| JP | 9-330875 | 12/1997 |
| JP | 2005-150615 | 6/2005 |
| JP | 2006-165564 | 6/2008 |
| JP | 2008-219001 | 9/2008 |
| JP | 2008-300828 | 12/2008 |
| JP | 2010-199243 | 9/2010 |
| JP | 2011-142165 | 7/2011 |
| KR | 10-2008-0080459 | 9/2008 |

OTHER PUBLICATIONS

International Search Report and Written Opinion mailed May 9, 2014 in corresponding International Patent Application No. PCT/EP2013/074613.

Kouichi Kajiwara et al., "Application of large scale active microvibration control system using piezoelectric actuators to semiconductor manufacturing equipment," Proc. of SPIE, vol. 3044, pp. 258-269 (1977).

Matthijs Boerlage et al., "Frequency response based multivariable control design for motion systems," Proceedings of the 2005 IEEE Conference on Control Applications, pp. 980-985 (2005).

Dick A.H. Laro et al., "Design and Control of Over-Actuated Lightweight 450 mm Wafer Chuck," American Society for Precision Engineering, 4 pages (Spring 2010).

Rein Boshuisen, "Analysis and Performance of a lightweight over-actuated 450mm wafer chuck," Masters Thesis, Delft University, 94 pages (May 24, 2010).

Taiwan Office Action dated Nov. 2, 2015 in corresponding Taiwan Patent Application No. 102143313.

Korean Office Action mailed Sep. 27, 2016 in corresponding Korean Patent Application No. 10-2015-7017066 (8 pages).

* cited by examiner

LITHOGRAPHIC APPARATUS, SUBSTRATE SUPPORT SYSTEM, DEVICE MANUFACTURING METHOD AND CONTROL PROGRAM

CROSS-REFERENCE TO RELATED APPLICATIONS

This application is the U.S. National Stage of PCT/EP2013/074613, filed Nov. 25, 2013, which in turn claims the benefit of priority to U.S. provisional application Ser. No. 61/730,428, which was filed on Nov. 27, 2012, the entire contents of all applications are incorporated herein by reference in their entireties.

FIELD

The present invention relates to a lithographic apparatus, a substrate support system, a device manufacturing method and a control program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

SUMMARY

Most current lithographic apparatus operate in a so-called scanning mode, in order to maximize the exposable field size and throughput without requiring excessively large optical systems. In a scanning exposure, the pattern, e.g. on a mask, is scanned through the field of view of a projection system whilst simultaneously the substrate is scanned in synchronism through the image field of the projection system. Positioning errors during this dynamic process, for example overlay errors and focus errors, should be kept within acceptable limits, which tend to become stricter with reductions in the sizes of features to be formed. Increasing substrate sizes also make the problem of positioning the substrate table and associated components harder.

Therefore, it is desirable to provide a technique for improving dynamic positioning of objects in a lithographic apparatus in order to reduce overlay and other positioning errors.

According to an aspect of the invention, there is provided a lithographic apparatus comprising a driven object having compliant dynamics; a plurality of actuators configured to act on the driven object, wherein the plurality of actuators are over-determined in an actuator degree of freedom; a control system comprising a transformation matrix configured to generate controller output signals for each of the plurality of actuators in response to a setpoint, wherein the transformation matrix is configured such that the controller output signals do not excite the compliant dynamics of the driven object in at least one degree of freedom.

According to an aspect of the invention, there is provided a substrate support system comprising: a substrate table having compliant dynamics; a plurality of actuators configured to act on the substrate table, wherein the plurality of actuators are over-determined in an actuator degree of freedom; a control system comprising a transformation matrix configured to generate controller output signals for each of the plurality of actuators in response to a setpoint, wherein the transformation matrix is configured such that the controller output signals do not excite the compliant dynamics of the substrate table in at least one degree of freedom.

According to an aspect of the invention, there is provided a lithographic apparatus comprising: a driven object having compliant dynamics; a plurality of actuators configured to act on the driven object; a plurality of sensors each configured to provide a sensor signal indicative of a position or displacement of the driven object, wherein the plurality of sensors are over-determined in a sensor degree of freedom; a transformation matrix configured to transform the sensor signals so as to not observe the effects of the compliant dynamics of the driven object in at least one degree of freedom, and a control system configured to generate controller output signals for each of the plurality of actuators in response to a setpoint and the transformed sensor signals.

According to an aspect of the invention, there is provided a device manufacturing method using a lithographic apparatus, the method comprising: supporting a substrate on a substrate table having compliant dynamics and a plurality of actuators configured to act on the substrate table, wherein the plurality of actuators are over-determined in an actuator degree of freedom; projecting a patterned beam onto the substrate to expose it to the respective pattern whilst positioning the substrate table; wherein positioning the substrate table comprises applying a transformation matrix to a setpoint to generate controller output signals for each of the plurality of actuators, the transformation matrix being configured such that the controller output signals do not excite the compliant dynamics of the substrate table in at least one degree of freedom.

According to an aspect of the invention, there is provided a device manufacturing method using a lithographic apparatus, the method comprising: supporting a substrate on a substrate table having compliant dynamics and a plurality of actuators configured to act on the substrate table: using a plurality of sensors to generate respective sensor signals that are indicative of a position of at least one of the substrate and the substrate table, wherein the plurality of sensors are over-determined in a sensor degree of freedom; projecting a patterned beam onto the substrate to expose it to the respective pattern whilst positioning the substrate table; and applying a transformation matrix to the sensor signals to generate transformed sensor signals, the transformation matrix being configured such that the transformed sensor signals do not observe the compliant dynamics of the substrate table in at least one degree of freedom.

According to an aspect of the invention, there is provided a control program for a lithographic apparatus having a substrate table having compliant dynamics and a plurality of actuators configured to act on the substrate table, wherein the plurality of actuators are over-determined in an actuator degree of freedom, the program comprising code that, when executed by a computer system, instructs the computer system to: apply a transformation matrix to a setpoint to generate controller output signals for each of the plurality of actuators, the transformation matrix being configured such that the controller output signals do not excite the compliant dynamics of the substrate table in at least one degree of freedom.

According to an aspect of the invention, there is provided a control program for a lithographic apparatus having a substrate table having compliant dynamics, a plurality of actuators configured to act on the substrate table, and a plurality of sensors configured to generate respective sensor output signals that are indicative of a position of at least one of the substrate table and a substrate supported by the substrate table, wherein the plurality of sensors are over-determined in a sensor degree of freedom, the program comprising code that, when executed by a computer system, instructs the computer system to: apply a transformation matrix to the sensor signals to generate transformed sensor signals, the transformation matrix being configured such that the transformed sensor signals do not observe the compliant dynamics of the substrate table in at least one degree of freedom.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
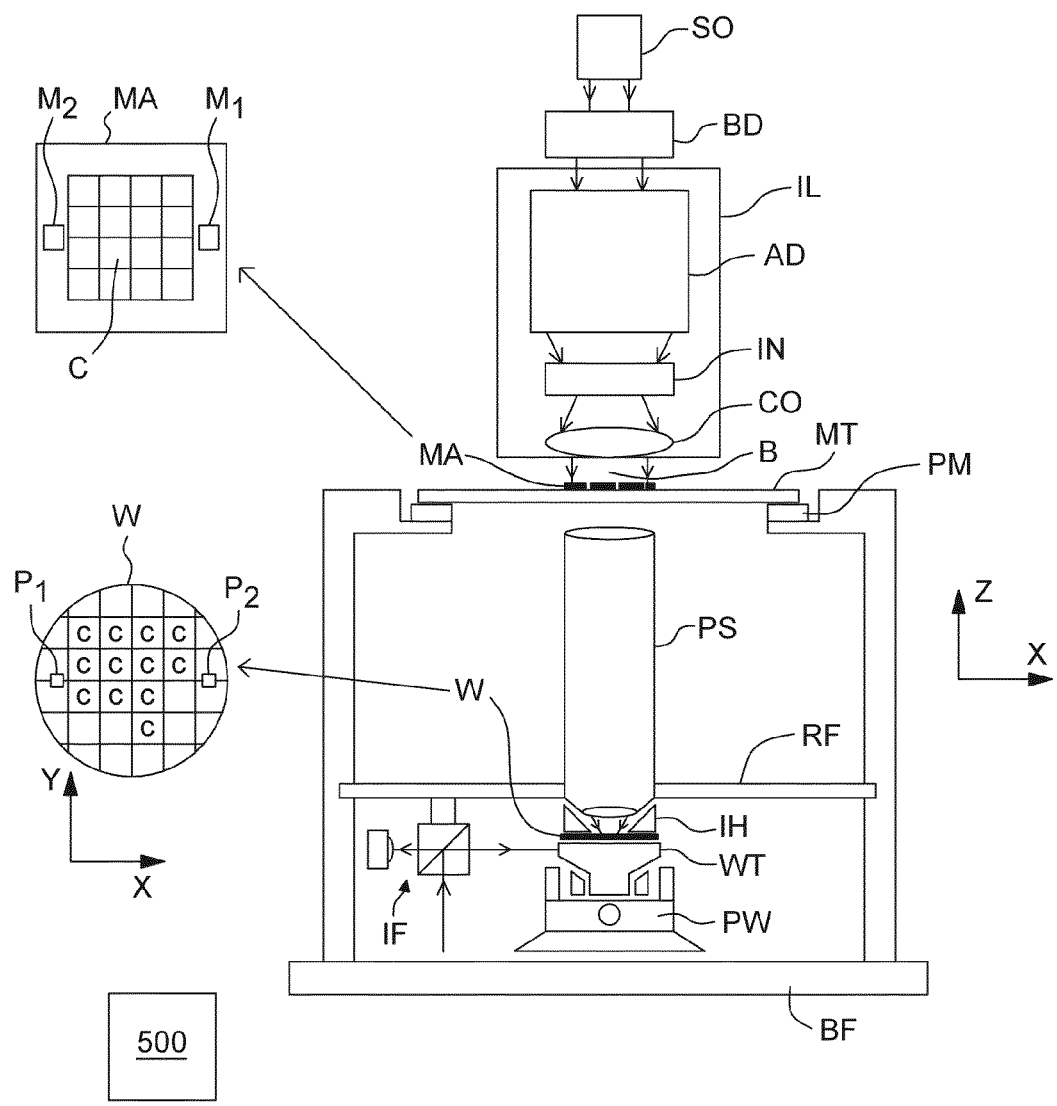
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation, DUV radiation or EUV radiation);
- a support structure or patterning device support (e.g. a mask table) MT constructed to support a patterning device (e.g. a mask) Ma and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device Ma onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The terms "projection system" used herein should be broadly interpreted as encompassing any type of system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more substrate support structures, such as substrate stages or substrate tables, and/or two or more support structures for patterning devices. In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment of the invention one or more of the multiple substrate stages is replaced by a measurement stage. A measurement stage includes at least a part of one or more sensor systems such as a sensor detector and/or target of the sensor system but does not support a substrate. The measurement stage is positionable in the projection beam in place of a substrate stage or a support structure for a patterning device. In such apparatus the additional stages may be used in parallel, or preparatory steps may be carried out on one or more stages while one or more other stages are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. Substrate W is held on the substrate table WT by a substrate holder according to an embodiment of the present invention and described further below. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a patterning device library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device Ma and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In many lithographic apparatuses, a fluid, in particular a liquid, is provided between the final element of the projection system using a liquid supply system IH to enable imaging of smaller features and/or increase the effective NA of the apparatus. An embodiment of the invention is described further below with reference to such an immersion apparatus, but may equally be embodied in a non-immersion apparatus. Arrangements to provide liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Another arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin-film, of liquid on the substrate.

Four different types of localized liquid supply systems are illustrated in FIGS. 2 to 5. Any of the liquid supply devices of FIGS. 2 to 5 may be used in an unconfined system; however, sealing features are not present, are not activated, are not as efficient as normal or are otherwise ineffective to seal liquid to only the localized area.

Figure 2:
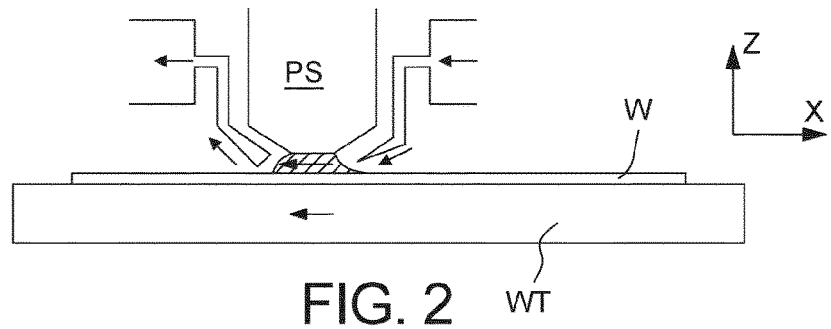
FIGS. 2 and 3 depict a liquid supply system for use in a lithographic projection apparatus.
Figure 3:
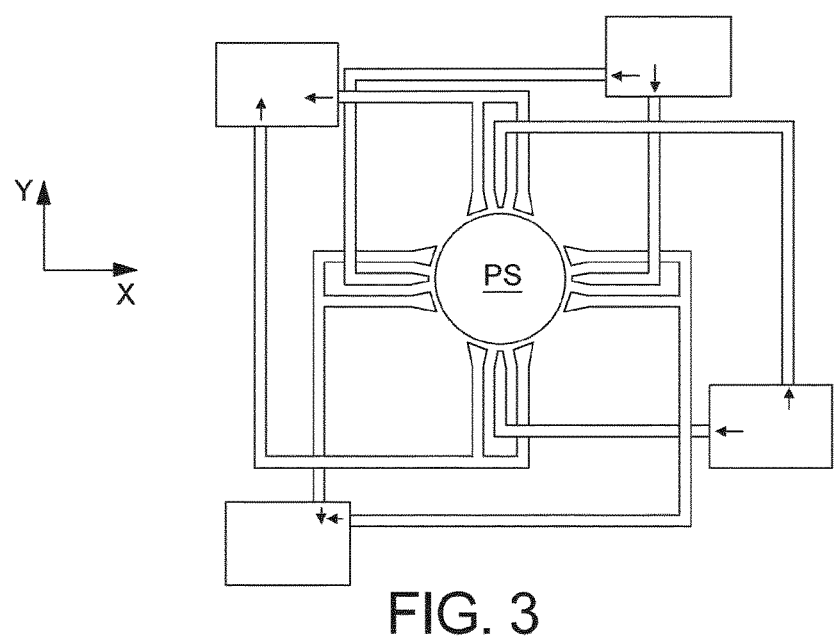

One of the arrangements proposed for a localized immersion system is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side.

FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
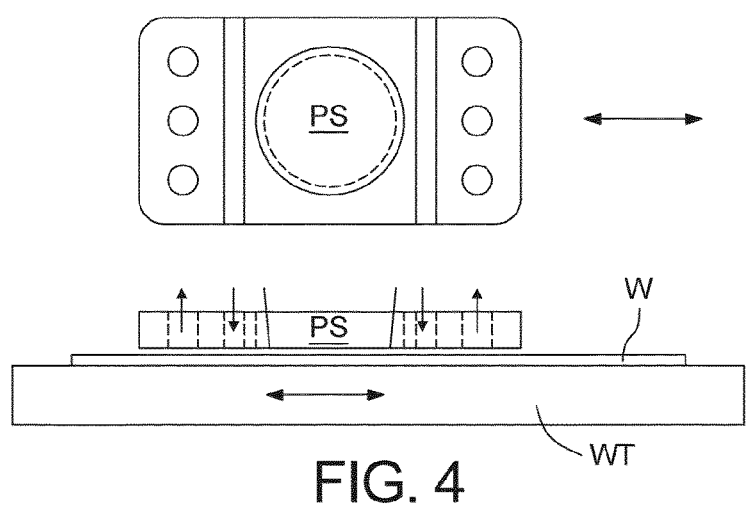
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin-film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in to inlets and out of outlets.

Figure 5:
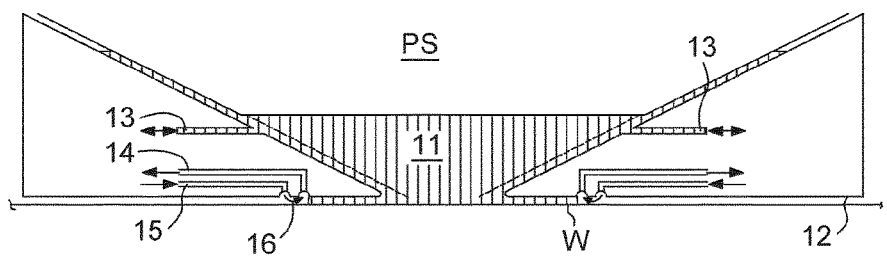
FIG. 5 depicts, in cross-section, a barrier member which may be used in an embodiment of the present invention as an immersion liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane, though there may be some relative movement in the Z direction (in the direction of the optical axis). A seal is formed between the liquid confinement member and the surface of the substrate. In an embodiment, a seal is formed between the liquid confinement member and the surface of the substrate and may be a contactless seal such as a gas seal. Such a system is disclosed in United States patent application publication no. US 2004-0207824.

The fluid handling structure 12 includes a liquid confinement member and at least partly contains liquid in the space 11 between a final element of the projection system PS and the substrate W. A contactless seal 16 to the substrate W may be formed around the image field of the projection system so that liquid is confined within the space between the substrate W surface and the final element of the projection system PS. The space is at least partly formed by the fluid handling structure 12 positioned below and surrounding the final element of the projection system PS. Liquid is brought into the space below the projection system and within the fluid handling structure 12 by liquid inlet 13. The liquid may be removed by liquid outlet 13. The fluid handling structure 12 may extend a little above the final element of the projection system. The liquid level rises above the final element so that a buffer of liquid is provided. In an embodiment, the fluid handling structure 12 has an inner periphery that at the upper end closely conforms to the shape of the projection system or the final element thereof and may, e.g., be round. At the bottom, the inner periphery closely conforms to the shape of the image field, e.g., rectangular, though this need not be the case.

In an embodiment, the liquid is contained in the space 11 by a gas seal 16 which, during use, is formed between the bottom of the fluid handling structure 12 and the surface of the substrate W. The gas seal is formed by gas, e.g. air, synthetic air, $N_2$ or another inert gas. The gas in the gas seal is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow 16 inwardly that confines the liquid. The force of the gas on the liquid between the fluid handling structure 12 and the substrate W contains the liquid in a space 11. The inlets/outlets may be annular grooves which surround the space 11. The annular grooves may be continuous or discontinuous. The flow of gas 16 is effective to contain the liquid in the space 11. Such a system is disclosed in United States patent application publication no. US 2004-0207824.

The example of FIG. 5 is a localized area arrangement in which liquid is only provided to a localized area of the top surface of the substrate W at any one time. Other arrangements are possible, including fluid handling systems which make use of a single phase extractor or a two phase extractor as disclosed, for example, in United States patent application publication no US 2006-0038968.

Many other types of liquid supply system are possible. Embodiments of the present invention are neither limited to any particular type of liquid supply system, nor to immersion lithography. Embodiments of the invention may be applied equally in any lithography. In an EUV lithography apparatus, the beam path is substantially evacuated and immersion arrangements described above are not used.

A control system (also broadly termed controller) 500 shown in FIG. 1 controls the overall operations of the lithographic apparatus and in particular performs an optimization process described further below. Control system 500 can be embodied as a suitably-programmed general purpose computer comprising a central processing unit and volatile and non-volatile storage. Optionally, the control system may further comprise one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment of the invention one computer can control multiple lithographic apparatuses. In an embodiment of the invention, multiple networked computers can be used to control one lithographic apparatus. The control system 500 may also be configured to control one or more associated process devices and substrate handling devices in a lithocell or cluster of which the lithographic apparatus forms a part. The control system 500 can also be configured to be subordinate to a supervisory control system of a lithocell or cluster and/or an overall control system of a fab.

Figure 6:
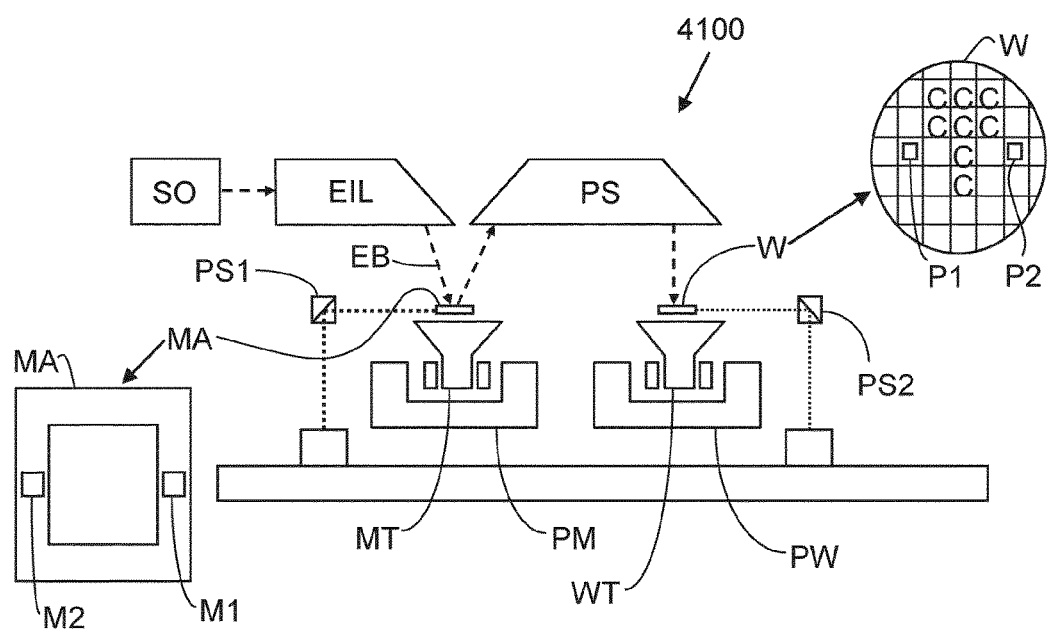
FIG. 6 depicts a lithographic apparatus according to an embodiment of the invention.

FIG. 6 schematically depicts an EUV lithographic apparatus 4100 including a source collector apparatus SO. The apparatus comprises:

an illumination system (illuminator) EIL configured to condition a radiation beam B (e.g. EUV radiation);

a support structure (e.g. a mask table) MT constructed to support a patterning device (e.g. a mask or a reticle) Ma and connected to a first positioner PM configured to accurately position the patterning device;

a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

These basic components of the EUV lithographic apparatus are similar in function to the corresponding components of the lithographic apparatus of FIG. 1. The description below mainly covers areas of difference and duplicative description of aspects of the components that are the same is omitted.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

Referring to FIG. 6, the EUV illuminator EIL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the desired line-emitting element, with a laser beam. The source collector apparatus SO may be part of an EUV radiation system including a laser, not shown in FIG. 6, to provide the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus, for example when the source is a discharge-produced plasma EUV generator, often termed as a DPP source.

The EUV illuminator EIL may comprise an adjuster to adjust the angular intensity distribution of the radiation beam EB. Generally, at least the outer and/or inner radial extent (commonly referred to as σ-outer and σ-inner, respectively) of the intensity distribution in a pupil plane of the illuminator can be adjusted. In addition, the EUV illuminator EIL may comprise various other components, such as facetted field and pupil mirror devices. The EUV illuminator EIL may be used to condition the radiation beam EB, to have a desired uniformity and intensity distribution in its cross section.

The radiation beam EB is incident on the patterning device (e.g., mask) MA, which is held on the support structure (e.g., mask table) MT, and is patterned by the patterning device. After being reflected from the patterning device (e.g. mask) MA, the radiation beam EB passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam EB. Similarly, the first positioner PM and another position sensor PS1 can be used to accurately position the patterning device (e.g. mask) MA with respect to the path of the radiation beam EB. Patterning device (e.g. mask) MA and substrate W may be aligned using mask alignment marks M1, M2 and substrate alignment marks P1, P2.

Figure 7:
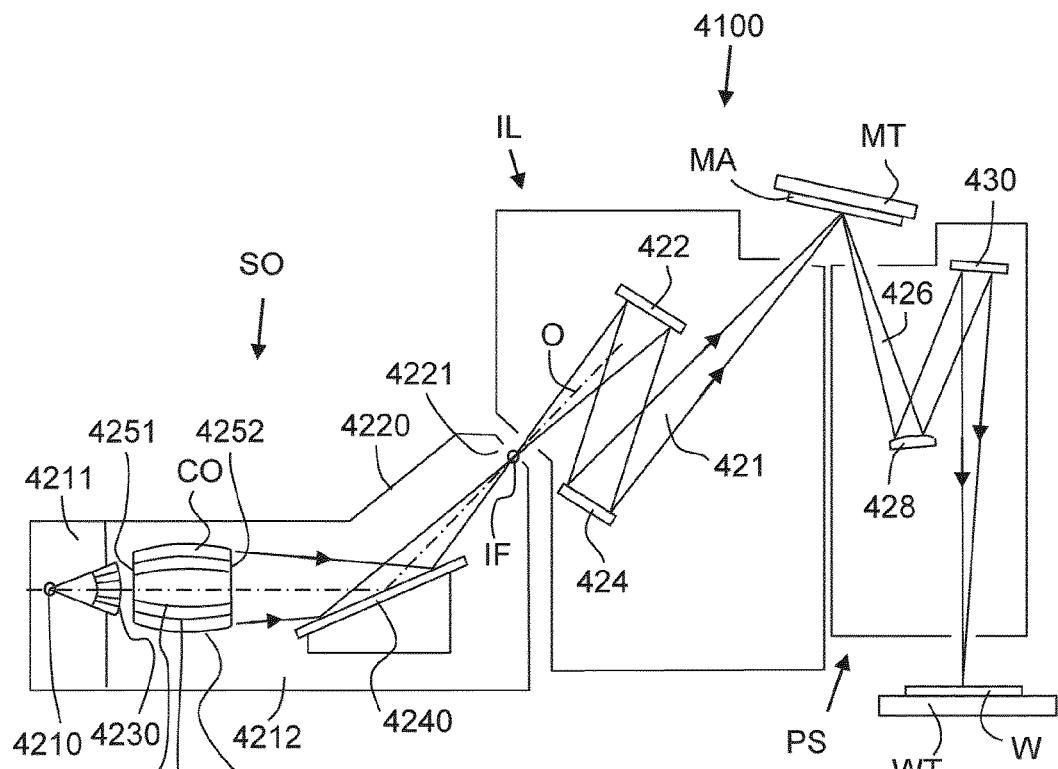
FIG. 7 is a more detailed view of the apparatus of FIG. 6.

The depicted apparatus can be used in the same modes as the apparatus of FIG. 1. FIG. 7 shows the EUV apparatus 4100 in more detail, including the source collector apparatus SO, the EUV illumination system EIL, and the projection system PS. The source collector apparatus SO is constructed and arranged such that a vacuum environment can be maintained in an enclosing structure 4220 of the source collector apparatus SO. An EUV radiation emitting plasma 4210 may be formed by a discharge produced plasma source. EUV radiation may be produced by a gas or vapor, for example Xe gas, Li vapor or Sn vapor in which the plasma 4210 is created to emit radiation in the EUV range of the electromagnetic spectrum. The plasma 4210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the plasma 4210 is passed from a source chamber 4211 into a collector chamber 4212 via an optional gas barrier and/or contaminant trap 4230 (in some cases also referred to as contaminant barrier or foil trap) which is positioned in or behind an opening in source chamber 4211. The contaminant trap 4230 may include a channel structure. Contamination trap 4230 may also include a gas barrier or a combination of a gas barrier and a channel structure. The contaminant trap or contaminant barrier 4230 further indicated herein at least includes a channel structure, as known in the art.

The collector chamber 4212 may include a radiation collector CO which may be a so-called grazing incidence collector. Radiation collector CO has an upstream radiation collector side 4251 and a downstream radiation collector side 4252. Radiation that traverses collector CO can be reflected by a grating spectral filter 4240 to be focused in a virtual source point IF. The virtual source point IF is commonly referred to as the intermediate focus, and the source collector apparatus is arranged such that the intermediate focus IF is located at or near an opening 4221 in the enclosing structure 4220. The virtual source point IF is an image of the radiation emitting plasma 4210.

Subsequently the radiation traverses the illumination system IL, which may include a facetted field mirror device 422 and a facetted pupil mirror device 424 arranged to provide a desired angular distribution of the radiation beam 421, at the patterning device MA, as well as a desired uniformity of radiation intensity at the patterning device MA. Upon reflection of the beam of radiation 421 at the patterning device MA, held by the support structure MT, a patterned beam 426 is formed and the patterned beam 426 is imaged by the projection system PS via reflective elements 428, 430 onto a substrate W held by the substrate stage or substrate table WT.

More elements than shown may generally be present in illumination optics unit IL and projection system PS. The grating spectral filter 4240 may optionally be present, depending upon the type of lithographic apparatus. There may be more mirrors present than those shown in the Figures, for example there may be from 1 to 6 additional reflective elements present in the projection system PS than shown in FIG. 7.

Collector optic CO, as illustrated in FIG. 7, is depicted as a nested collector with grazing incidence reflectors 4253, 4254 and 4255, just as an example of a collector (or collector mirror). The grazing incidence reflectors 4253, 4254 and 4255 are disposed axially symmetric around an optical axis O and a collector optic CO of this type is used, in an embodiment, in combination with a discharge produced plasma source, often called a DPP source.

Figure 8:
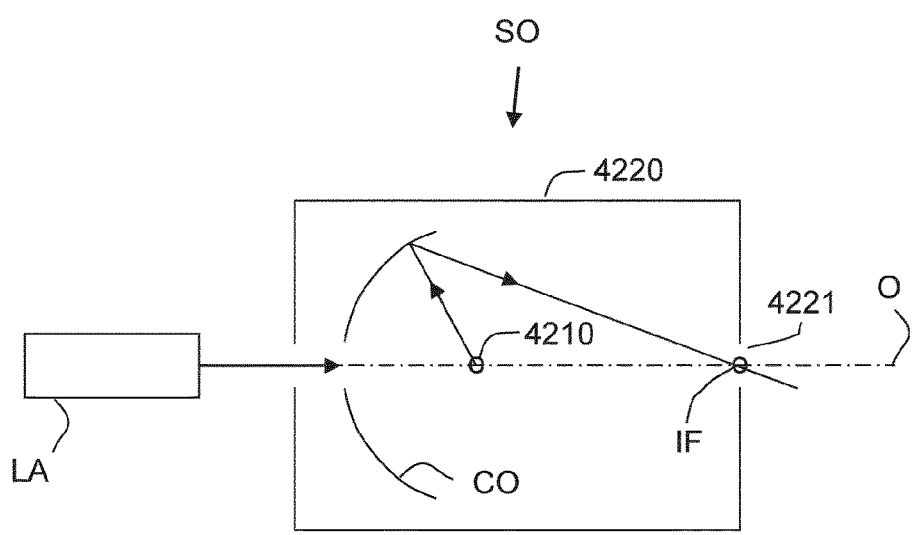
FIG. 8 is a more detailed view of the source collector apparatus of the apparatus of FIGS. 6 and 7.

Alternatively, the source collector apparatus SO may be part of an LPP radiation system as shown in FIG. 8. A laser LA is arranged to deposit laser energy into a fuel, such as xenon (Xe), tin (Sn) or lithium (Li), creating the highly ionized plasma 4210 with electron temperatures of several 10's of eV. The energetic radiation generated during de-excitation and recombination of these ions is emitted from the plasma, collected by a near normal incidence collector optic CO and focused onto the opening 4221 in the enclosing structure 4220.

In the field of lithography, there is a continuous objective to reduce the minimum feature size that can be imaged. To meet this objective, specifications on overlay (that is an error in positioning of an exposure in the XY plane parallel to the substrate surface) and focus (that is error in the vertical or Z position of the substrate during exposure) become stricter. In a scanning exposure mode, setpoint profiles are used during the exposure. The setpoints define a predetermined trajectory for the substrate during exposure of a die or target portion. In an embodiment, the setpoints take into account the substrate surface profile as determined during a pre-exposure measurement or characterization process. For accurate following of these setpoints, it is known to use high bandwidth feedback control in combination with acceleration feed forward control.

In an embodiment, a substrate table is a complex body having sensors (such as a spot sensor, energy sensor or aberration sensor), mirrors for an interferometric displacement measuring system and/or sensors for a grid-based displacement measuring system, fiducials for an alignment system, and a short-stroke positioning system for a substrate holder. The main part of the substrate table is made of a rigid material having a low coefficient of thermal conductivity, such as Zerodur™, and is stiff. In a known lithographic apparatus, the substrate table is controlled as a rigid body using a number of actuators equal to the number of degrees of freedom in which it is positioned. A known substrate table is positioned in six degrees of freedom—X, Y, Z, Rx, Ry and Rz—using six actuators.

The present inventors have determined that a known control system that takes account only of rigid body dynamics of a substrate holder does not meet increased performance criteria needed for further reductions in the size of features to be imaged and/or for use of substrates of increased size. To improve positioning accuracy in the known system, it would be possible to increase the stiffness of the driven object, so that it can again be considered a rigid body. However, increasing the stiffness of the driven body would require additional space and/or would increase the mass of the driven body, each of which is undesirable.

The present inventors propose, in order to meet increasingly strict positioning requirements, to also account for the flexible dynamics of the substrate table and other positioned objects in a lithographic apparatus. The flexible dynamics of a substrate table or other driven object can be considered as a low-frequency part and a high-frequency part that are referred to herein as "compliant behavior" and "resonant behavior" respectively. The compliant behavior dominates the resonant behavior between 0 Hz up to the first resonant mode of the driven object, which may be between 100 and 1000 Hz in the case of a substrate table or holder. In an embodiment of the invention, compliant behavior is considered to be the response of the driven object to disturbances of frequency from 0 Hz to a predetermined frequency, for example half the frequency of the first resonant mode of the driven object. In an embodiment, the predetermined frequency is 50 Hz, 200 Hz 250 Hz, 300 Hz or 500 Hz.

According to an embodiment of the present invention, it is proposed to provide additional actuators and/or additional sensors in a control system for positioning a driven object in order to avoid excitation of the compliant behavior of flexible modes or to avoid observation of the compliant behavior in the measured position.

The provision of additional actuators means that the number of actuators is greater than the number of degrees of freedom in which the driven object is positioned. In this context, an actuator may be a logical actuator made up of several different physical actuators which are activated in specific ratios in order to exert a net force along a line or about an axis that is displaced from the line of action of any one of the physical actuators. In an embodiment of the invention, the number of logical actuators is greater than the number of degrees of freedom in which the driven object is positioned. In an embodiment of the invention, a single physical actuator is part of two or more logical actuators but the total number of physical actuators in a system is not less than the total number of logical actuators in the system. In this document, a degree of freedom for which at least one additional logical or physical actuator is provided is referred to as "over-actuated".

The provision of additional sensors means that the number of sensors measuring the position of the driven object is greater than the number of degrees of freedom in which its position is measured. Similarly as with actuators, a sensor can be a logical sensor which provides a measurement value based on a combination of outputs of more than one physical sensor. A single physical sensor can be part of two or more logical sensors but the total number of physical sensors in a system is not less than the total number of logical sensors in the system. A sensor can include control circuitry that commands a sensor output to a position or displacement value. In this document, a degree of freedom for which at least one additional sensor is provided is referred to as "over-sensed".

Figure 9:
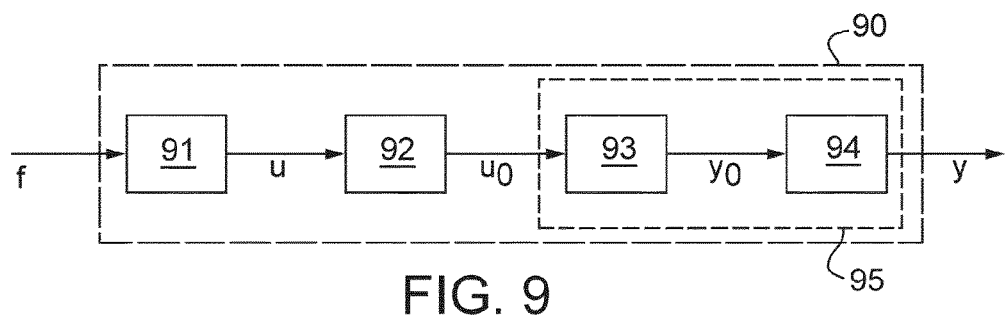
FIG. 9 depicts schematically a part of a mechanical and measurement system of an embodiment of the invention.

A part of the positioning system of an embodiment of the invention is depicted schematically in FIG. 9. The depicted system 90, which can be referred to as the plant to be controlled, forms part of a feedback loop and/or feed forward control system that is not shown. System 90 represents one degree of freedom, e.g. the Z direction, for which at least one additional actuator is provided. The input to the depicted system is a force setpoint f. A gain scheduler 91 transforms the force setpoint f which is provided in a predetermined reference frame to a transformed force value u in a transformed reference frame. The transformed reference frame is based on the location of the die or target portion to be or being exposed. The gain scheduler can be omitted in an embodiment of the invention.

A gain balancer 92 multiplies the transformed force value (or the force setpoint if the gain scheduler is omitted) by a balancing matrix to generate modified forces $u_0$ that decouple the rigid body modes as well as decoupling the compliant dynamics so that overlay and focus errors are reduced. The gain balancer controls the gains of the respective actuation system. The number of extra constraints, over the rigid body modes, that can be handled generally equals the number of extra actuators (i.e., the degree of over-actuation). In an embodiment of the invention, one extra actuator, e.g. a fourth vertical (Z) actuator, is provided and the compliance crosstalk from control forces to one axis can be minimized for low frequencies e.g. up to about half the first resonant frequency of the driven object. In another embodiment of the invention multiple extra actuators are provided and the cross-talk to multiple axes is minimized simultaneously.

Modified forces $u_0$ are applied to the physical system 93, which includes actuators which apply forces to the driven object responsive to the modified force values $u_0$ and sensors which provide outputs $y_0$ representative of the position of the driven object. Measurement system 94 converts sensor outputs $y_0$ to position values y in the predetermined reference frame. The physical system 93 and measurement system 94 can be referred to as the raw mechanics.

Figure 10:
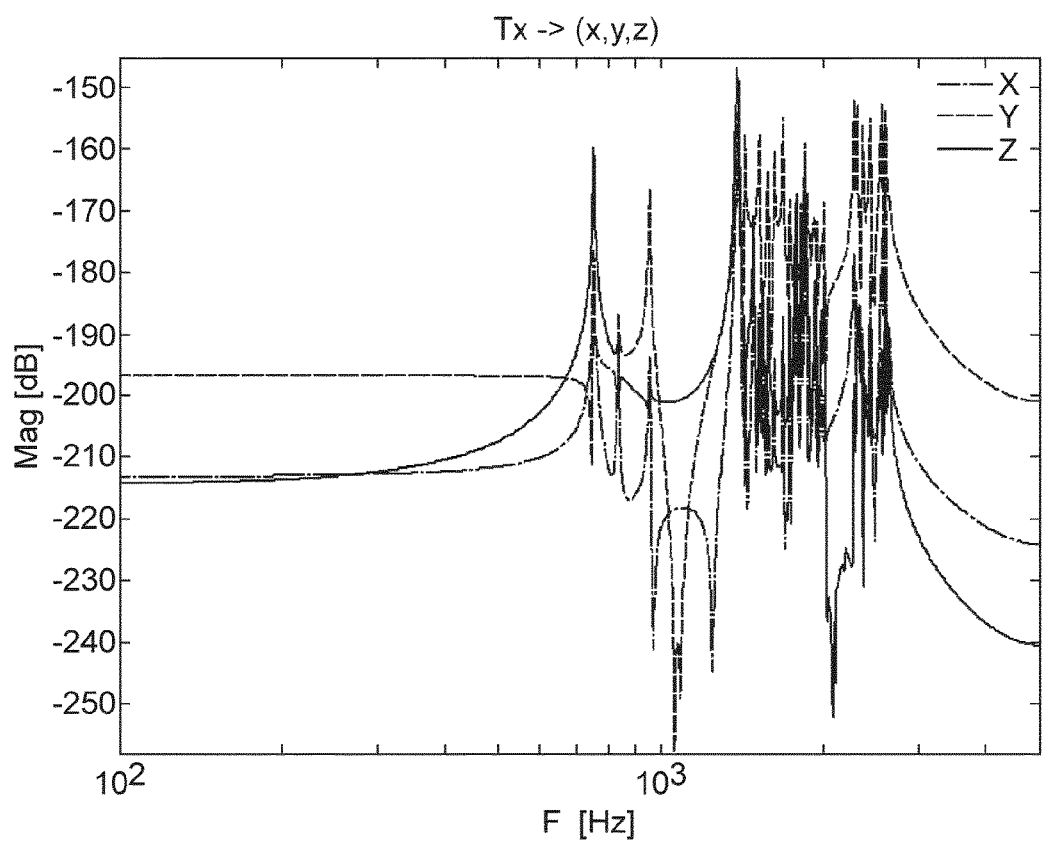
FIG. 10 is a Bode magnitude plot of the transfer functions from a Tx torque to x/y/z displacements in a conventional 6-DOF compensated mechanical system.

By way of an example, compliance decoupling at the input to the mechanical system, i.e. in the gain balancer 92, in an embodiment of the invention is now described. The example is used to demonstrate how the deformation in X-direction caused by a setpoint for torque about the X axis (Tx) (and also by the forces and torques in the other directions) can be minimized. FIG. 10 shows the transfer functions from a Tx torque to the individual X, Y, and Z displacements in the six degree of freedom compensated mechanics in reference system without compliance decoupling, i.e. not according to the invention. The horizontal axis in FIG. 10 represents frequency and the vertical axis relative magnitude.

The transfer function matrix with logical forces and torques in "u" and logical outputs in "y" can be written as a summation of the N mode shapes, equation 1. This summation assumes an undamped flexible substrate table, which is approximately true since the positioning systems are lightly damped.

$$y = \sum_{i=1}^{N} \frac{v_i^y v_i^u}{s^2 + k_i} \cdot u = \underbrace{\sum_{i=1}^{6} \frac{v_i^y v_i^u}{s^2} \cdot u}_{y_{rb}} + \underbrace{\sum_{i=7}^{N} \frac{v_i^y v_i^u}{s^2 + k_i} \cdot u}_{y_{nrb}}.$$

Eq. 1

The numbers i=1 to 6 represent the six rigid body modes and i=7 to N represent the flexible modes or Non-Rigid Body (NRB) modes. The $n_y \times 1$ column vector $v_i^y$ represents the displacements at the individual entries of y, i.e., at the output y of the measurement system 94 due to the $i^{th}$ mode. The $1 \times n_u$ row vector $v_i^u$ represents the displacements at the individual logical inputs in u, i.e., at the input of the gain balancer 91 due to the $i^{th}$ mode. Note that $v_i^y$ and $v_i^u$ are the eigenvectors of the flexible structure as seen by the measurement system and the actuator system, respectively. The multiplication of $v_i^y$ and $v_i^u$ yields an $n_y \times n_u$ matrix. In Equation (1), $k_i$ is the modal stiffness. Compliance is the reciprocal of stiffness: $1/k_i$. The total compliance between the inputs in u and the outputs in y can be determined by substituting s=0 in the expression for $y_{nrb}$ in Equation 1, resulting in Equation 2. This covers the "quasi-static" frequency range (note "qs" in the subscript in Equation 2) which starts at 0 Hz and may go up to a frequency of about 500 Hz, for example, as shown in FIG. 10.

$$y_{nrb,qs} = \sum_{i=7}^{N} \frac{v_i^y v_i^u}{k_i} \cdot u.$$

Eq. 2

The total compliance is the sum of the compliance contribution of each mode. This is illustrated in FIG. 10 for the single-input-single-output transfer functions between a Tx torque input and X, Y, and Z logical displacements outputs.

Figure 11:
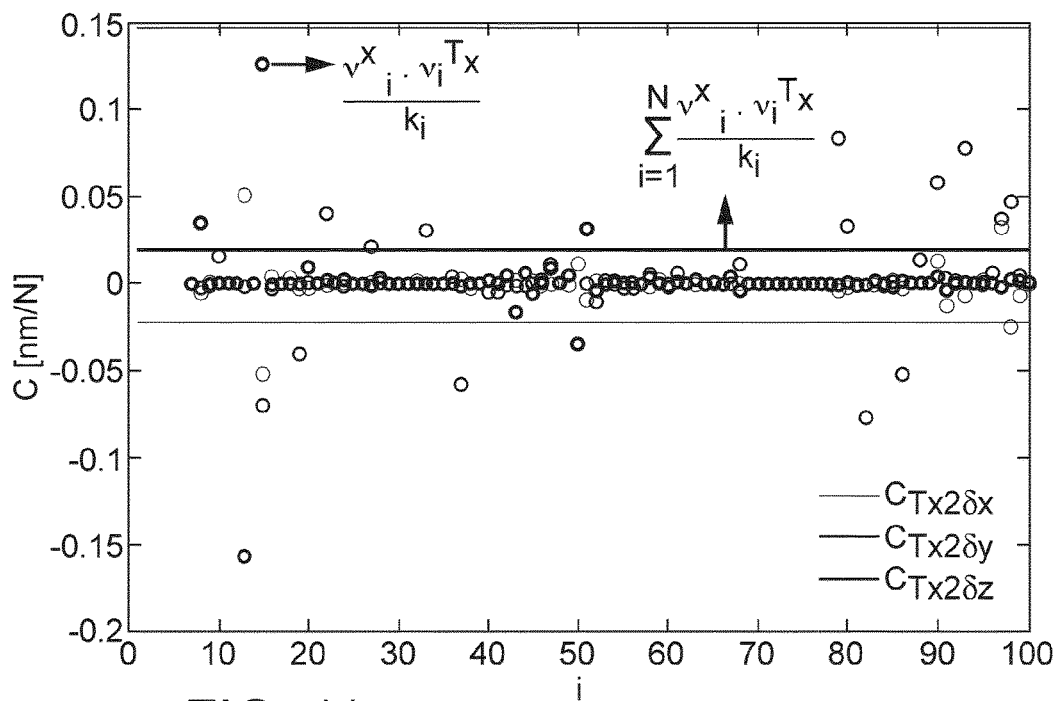
FIG. 11 depicts compliance per mode (circles) and total compliance (solid lines) for the compensated mechanical system of FIG. 10.

FIG. 11 shows compliance per mode (circles) and total compliance (solid lines) for the mechanical system 95 (without compliance decoupling) from Tx control torque to X (thin line), Y (medium line), and Z (thick line) displacements from the measurement system 94. The horizontal axis in FIG. 11 is mode number, the vertical axis is compliance in nm/N.

To illustrate how the total compliance can be reduced in an embodiment of the invention, the following expression is needed that gives the displacements at the logical inputs in u due to the physical actuators in $u_0$ and corresponding to the $i^{th}$ mode:

$$v_i^u = v_i^{u0} \cdot GB.$$

Eq. 3

Note that $v_i^u$ and $v_i^{u0}$ are row vectors of dimension $1 \times n_u$ and $1 \times n_{u0}$, respectively, and that GB is an $n_{u0} \times n_u$ matrix. GB is the gain balancing matrix embodied in the gain balance 92. Substituting this expression for $v_i^u$ into Equation 2 yields:

$$y_{nrb,qs} = \sum_{i=7}^{N} \frac{v_i^y v_i^{u0}}{k_i} \cdot GB \cdot u.$$

Eq. 4

The compliance crosstalk from the logical inputs in u to the logical outputs in y is zero if the following relation holds:

$$\sum_{i=7}^{N} \frac{v_i^y v_i^{u0}}{k_i} \cdot GB = 0.$$

Eq. 5

Full compliance decoupling is only possible in case of a sufficient degree of over-actuation, because six actuators are already required for rigid body decoupling. In general, one additional actuator will enable compliance decoupling towards one additional logical output. A selection matrix S is now added to Equation 5, to express which of the outputs in y is subject to compliance decoupling. S is a "big matrix" that can be made by taking an identity matrix and skipping those rows that correspond to outputs that are not subject to compliance decoupling:

Compliance decoupling:

$$S \cdot \sum_{i=7}^{N} \frac{v_i^y v_i^{u0}}{k_i} \cdot GB = 0.$$

Eq. 6

This constraint is effected by the gain balancer 92, in addition to constraints to decouple rigid body motions to minimize the compliance cross-talk related to a certain motion degree of freedom. In view of rigid body decoupling, the gain balancer 92 in an embodiment of the invention is designed to enforce a diagonalized rigid body behavior of the compensated mechanical system, which may be referred to as the desired mechanical system $P_d$. We define the raw mechanics $P_r := MS \cdot P_0$, where $P_0$ is a rigid body model of the physical system 93 with non-zero cross-terms and MS if the output of the measurement system 94. The gain balancing matrix for rigid body decoupling now fulfills the following equation:

Rigid body decoupling:

$$\underbrace{MS \cdot P_0}_{P_r} \cdot GB \cdot GS = P_d \Leftrightarrow P_r \cdot GB = P_d \cdot GC^{-1}.$$

Eq. 7

Note that $1/s^2$ (representing the rigid body dynamics) is not present here, since $1/s^2$ in $P_d$ cancels against $1/s^2$ in $P_0$. GS is the gain scheduling matrix embodied in the gain scheduler 91. The gain scheduler 91 is optional and if omitted GS is set to be an identity matrix I in the relevant equations. Equation 7 and Equation 6 are now stacked together to give the following explicit expression for a gain balancing matrix that achieves simultaneous rigid body decoupling for all six motion degrees of freedom and compliance decoupling for the motion degrees of freedom selected in S:

$$\begin{bmatrix} P_r \\ S \cdot \sum_{i=7}^{N} \frac{v_i^y v_i^{u0}}{k_i} \end{bmatrix} \cdot GB = \begin{bmatrix} P_d \cdot GS^{-1} \\ 0 \end{bmatrix} \Leftrightarrow GB =$$

Eq. 8

$$\begin{bmatrix} P_r \\ S \cdot \sum_{i=7}^{N} \frac{v_i^y v_i^{u0}}{k_i} \end{bmatrix}^{-1} \cdot \begin{bmatrix} P_d \cdot GS^{-1} \\ 0 \end{bmatrix}.$$

With the appropriate number of actuators, exact matrix inversion is possible: $n_{u0}$ (the number of actuators) should be equal to $n_y$ (the number of sensors, usually six) plus the number of outputs to be compliance-decoupled (i.e., the number of rows in S).

Figure 12:
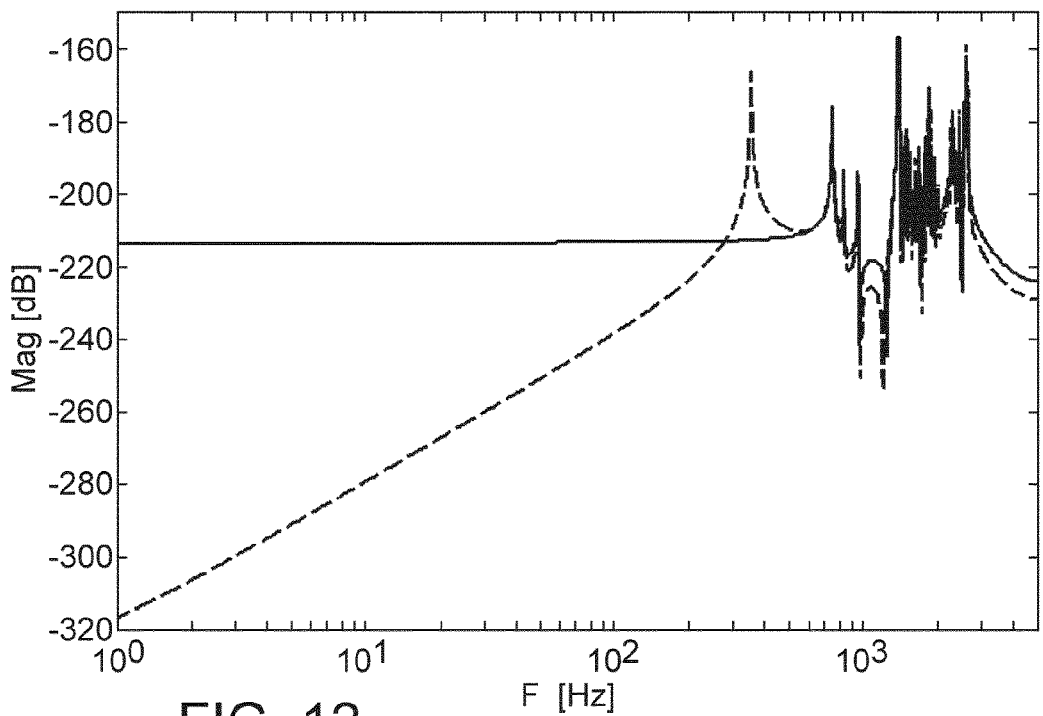
FIG. 12 is a Bode magnitude plot of the transfer function from a Tx torque to an x displacement in a mechanical system without and with a control system embodying the present invention.
Figure 13:
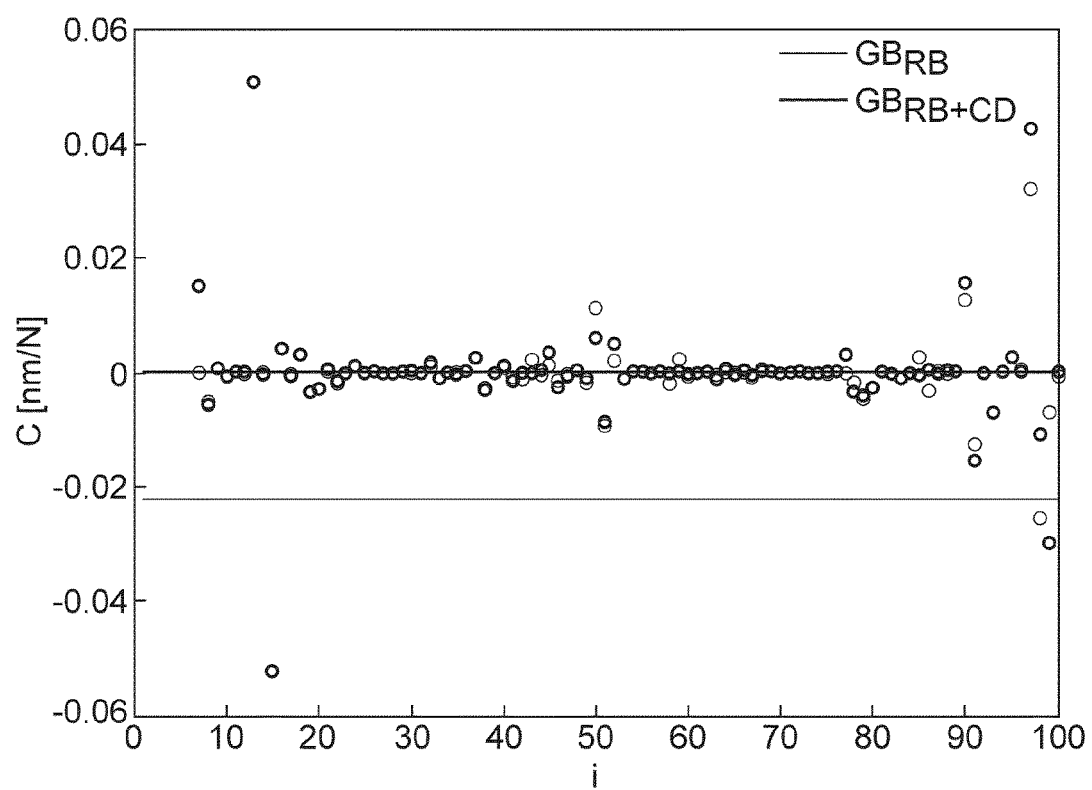
FIG. 13 depicts compliance per mode (circles) and total compliance (solid lines) for the compensated mechanical system without and with a control system according to an embodiment of the invention.
Figure 14A:
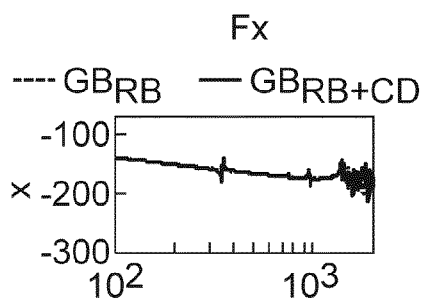
FIGS. 14A to F depict responses relative to the x-axis for a conventional control system design and a control system embodying the present invention.
Figure 14B:
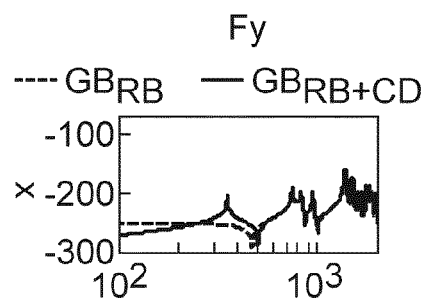
Figure 14C:
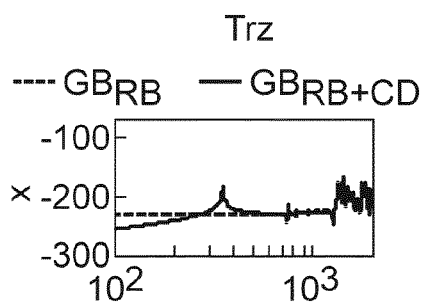
Figure 14D:
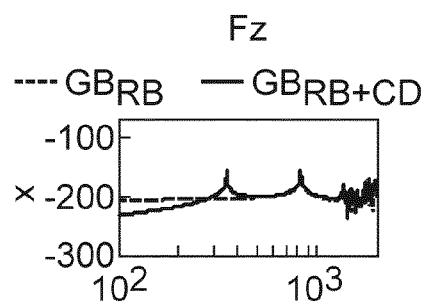
Figure 14E:
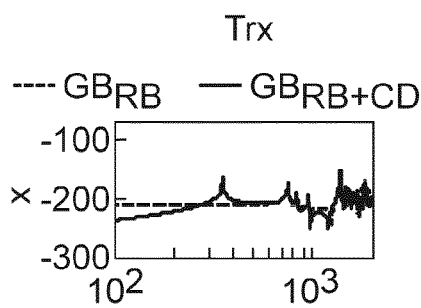
Figure 14F:
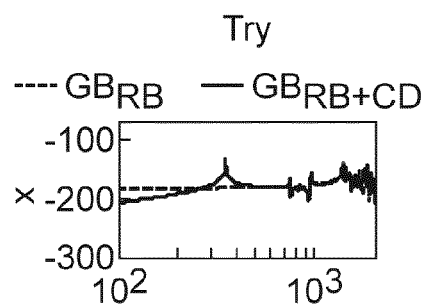

For the specific case considered here, FIG. 12 shows the transfer from the Tx torque input to the X displacement output for a conventional gain balancer (solid line) and for an embodiment of the invention (dashed line). The horizontal axis in FIG. 12 represents frequency and the vertical axis relative magnitude. It can be seen that the compliance line has disappeared for the embodiment of the present invention. The effectiveness of the approach is also shown in FIG. 13 where the sum of the compliance contributions (thick line) of the individual modes is zero for the embodiment of the invention. The horizontal axis in FIG. 13 is mode number, the vertical axis is compliance in nm/N. Where only rigid body modes are is effected the sum of compliance contributions (thin line) is non-zero. FIG. 14 shows that the X-direction is in fact not only compliance-decoupled for an Tx-torque, but rather for all six force and torque control inputs. To also compensate for compliance in the Y- and Z-axes, two extra actuators would be needed (more generally, to compensate for compliance in "N" axes, "N" extra actuators in addition to the actuators for rigid body control are needed).

Figure 15:
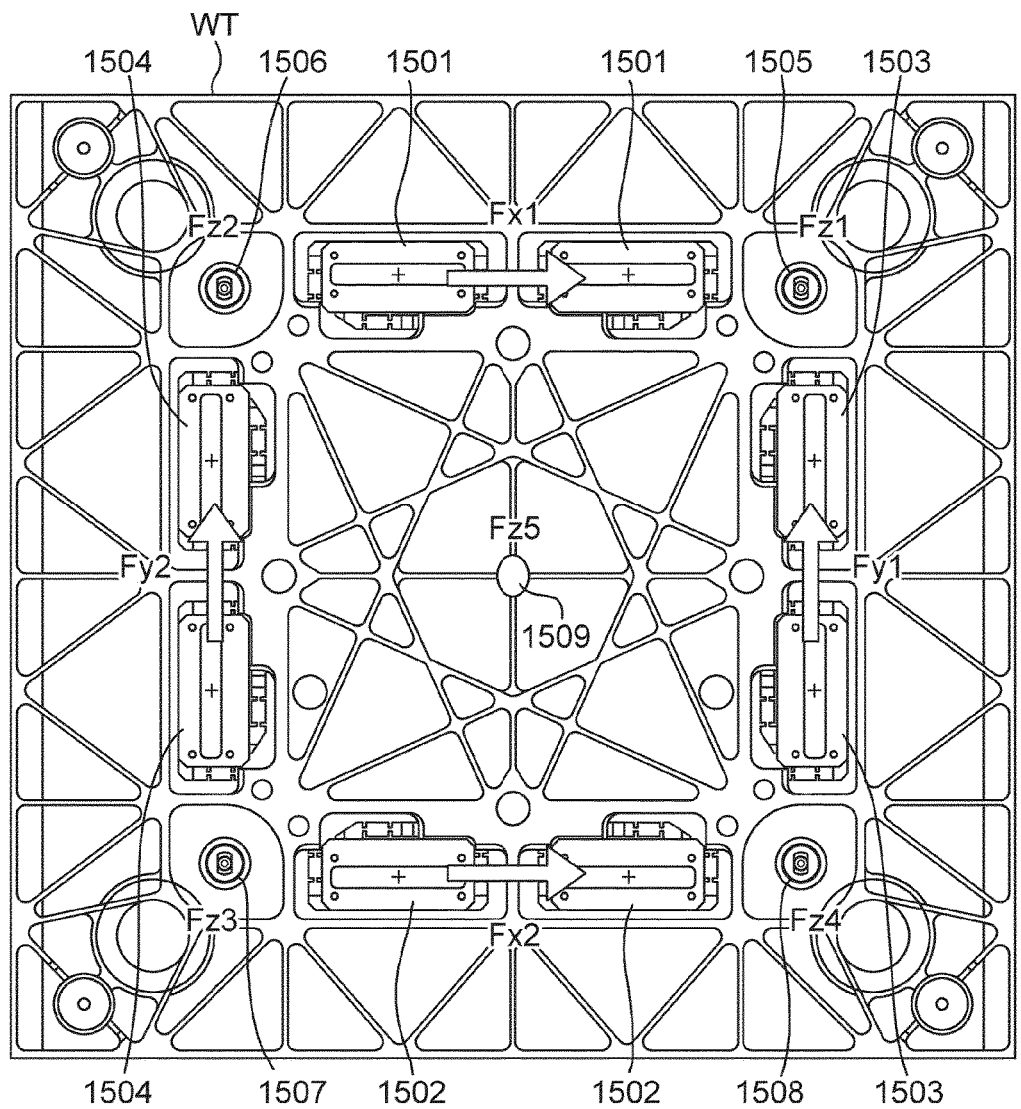
FIG. 15 depicts a substrate table including a short-stroke actuator system according to an embodiment of the invention.

In FIG. 15, an actuator layout for an embodiment of the invention is shown. In this embodiment a short-stroke drive system for a substrate table has nine effective actuators 1501 to 1509 to compensate for compliance in the three translations X, Y and Z. Note that in the horizontal plane there are only four (instead of eight) effective actuators 1501 to 1504 which exert forces Fx1, Fx2, Fy1 and Fy2, while in the vertical plane there are five effective actuators 1505 to 1509 which exert forces Fz1 to Fz5. A combination of horizontal and vertical over actuation is used for compliance decoupling towards X, Y and Z, whereas in the first embodiment described above only vertical over-actuation is used for compliance decoupling for X (and equivalently could also have been used for Y or Z).

With the gain balancer design in an embodiment of the invention providing compliance decoupling, it is possible that certain flexible modes would be excited more in their resonant dynamics than with a conventional gain balancer design. This can clearly be seen about 350 Hz in FIG. 12. The reason for this possible degradation is that in an embodiment of the present invention there need not be an explicit measure to prevent this from happening. However, the frequency content of the substrate setpoint profiles is generally below 200 Hz. In an embodiment, the gain balancer, performing compliance decoupling, is restricted to the feed forward path for wafer setpoints only, as shown in FIG. 16.

Figure 16:
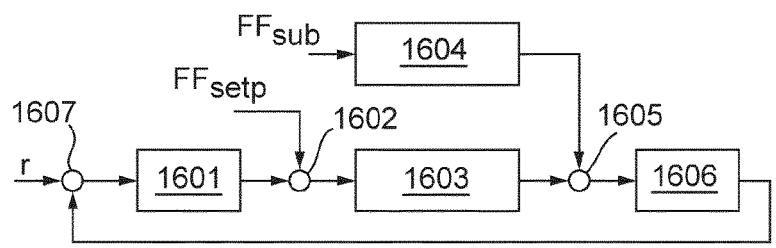
FIG. 16 depicts a control scheme according to an embodiment of the invention.

In the embodiment of FIG. 16, a main feedback loop is formed by controller 1601, e.g. a PID controller, and the mechanical system 1606 comprising driven object, actuators and sensor system and controllers. The sensor output of the mechanical system 1606 is subtracted from a position setpoint r to provide the input to controller 1601. The output of controller 1601 is combined in adder 1602 with feed forward force commands $FF_{setp}$ based on the x/y setpoints in r. The combined feed forward and feedback force commands are provided to first gain balancer 1603 which distributes the force to be applied across the available actuators in such a manner as to decouple both rigid body motion and resonant modes, thus preventing excitation of resonant dynamics. The feed forward corrections to address substrate topography $FF_{sub}$ are processed by a second gain balancer 1604 which implements an embodiment of the present invention and decouples compliant behavior and added by adder 1605 to the output of the first gain balancer 1603.

In an embodiment of the invention using an interferometer measurement system the vector $v_i^y$ in Equations 4 to 8 varies as function of the actual position p. It is desirable to provide a model of $v_i^y(p)$ to improve compliance decoupling. In an embodiment of the invention using an encoder measurement system, $v_i^y$ is fixed for the regions in which the same (number of) encoders are used and such a model may be omitted.

In an embodiment of the invention, the measurement system is further configured to take account of the location of the exposure, referred to as the true Point Of Interest (POI) taking account of Internal Deformation (ID) of the driven object, e.g. a substrate stage. In other words, the embodiment takes account of the difference between the POI and the Point Of Control (POC). The position of the POC is represented by y in FIG. 9 and is an estimate of the position of the actual POI based on sensor information in $y_0$ and assumptions (e.g. rigid body behavior) in the measurement system 95. In such an embodiment, additional sensors are provided so that the driven object is "over-sensed". This is described further below. In another embodiment, compliance decoupling is performed towards the point of interest on the substrate. In such an embodiment, $v_i^y$ in Equations 4 to 8 is replaced by vr, where the superscript "poi" refers to the displacements (eigenvectors) as seen at the point of interest instead of the displacements seen at the point of control contained in $v_i^y$.

Figure 17:
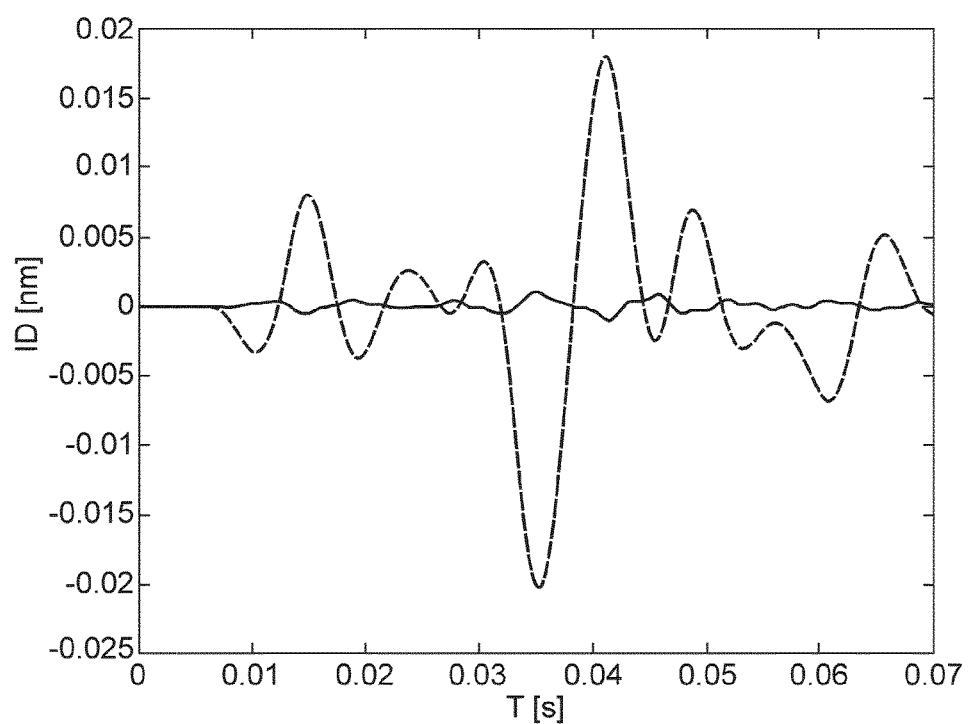
FIG. 17 depicts internal deformation of a substrate holder with a conventional control system and with a control system according to an embodiment of the invention.

In an embodiment of the invention, the gain balancer is configured so that the compliance decoupling reduces the internal deformation (ID) of the driven object, which is defined as the difference between the point of interest and the point of control. In this case, $v_i^y$ in Equations 4 to 8 should be replaced by the difference $(v_i^{poi} - v_i^y)$. The effectiveness of this approach is shown in FIG. 17 which shows internal deformation ID as a function of time T in part of a typical exposure movement. As can be seen the ID in x-direction due to an Rx-wafer setpoint is reduced by a factor 20 in the embodiment of the present invention (solid line) compared to a conventional apparatus (dashed line).

In an embodiment of the invention, compliance decoupling takes place at the input to the mechanical system, avoiding the excitation of compliant dynamics. In an embodiment of the invention, alternatively or in addition, compliance decoupling is done at the output of the mechanical system (as part of the measurement system 94 instead of the gain balancer 92). To enable compliance decoupling at the output, additional sensors are provided so that the system is over-sensed, instead of or in addition to being over-actuated. In that way, the rigid body estimate of the measured axes is improved, such that the feedback controller does not react to compliant effects that would otherwise be present in the measured axes. The starting point is again Equation 2. However, instead of Equation 3 including the gain balancing matrix, the following equation including the MS matrix (embodied in measurement system 94) is introduced:

$$v_i^y = MS \cdot v_i^{y0}. \qquad \text{Eq.9}$$

Here, $v_i^{y0}$ is an $n_{y0} \times 1$ column vector with the displacements at the $n_{y0}$ physical sensors and MS has dimension $n_y \times n_{y0}$, with $n_y$ the number of logical axis (usually six).

Substituting Equation 9 into Equation 2 then yields:

$$y_{nrb,qs} = MS \cdot \sum_{i=7}^{N} \frac{v_i^{y0} v_i^{u}}{k_i} \cdot u. \quad \text{Eq. 10}$$

Full compliance coupling (i.e., making $y_{nrb,qs}$ equal to zero) would require a sufficient degree of over-sensing, because six sensors are already needed for rigid body decoupling in the measurement system. Therefore, again a selection matrix S is added, but now this is related to the entries of the control inputs in u rather than to the entries of the measurement system output in y:

Compliance decoupling at the output:

$$MS \cdot \sum_{i=7}^{N} \frac{v_i^{y0} v_i^{u}}{k_i} S = 0 \quad \text{Eq. 11}$$

Here, S is a "tall matrix" that can be made by taking an identity matrix and skipping those columns that correspond to inputs that are not subject to compliance decoupling. Together with the requirement that the measurement system should pursue rigid body decoupling, the following explicit expression of measurement system results that achieves simultaneous rigid body decoupling of all motion degrees of freedom and compliance decoupling of the inputs selected in S (compare with Equation 8):

$$MS \cdot \left[ P_0 \cdot GB \quad \sum_{i=7}^{N} \frac{v_i^{y0} v_i^{u}}{k_i} S \right] = [ P_d \cdot GS^{-1} \quad 0 ] \quad \text{Eq. 12}$$

$$\Leftrightarrow MS = [ P_d \cdot GS^{-1} \quad 0 ] \cdot \left[ P_0 \cdot GB \quad \sum_{i=7}^{N} \frac{v_i^{y0} v_i^{u}}{k_i} S \right]^{-1}$$

With the appropriate number of sensors, exact matrix inversion is possible: $n_{y0}$ is equal to $n_u$ (the number of logical inputs or actuators, usually six) plus the number of inputs to be compliance-decoupled (number of columns of S).

When applying the procedure above, the columns in P, representing the plant 90, that correspond to the selected inputs in u are enforced to exhibit no compliant dynamics (whereas for compliance decoupling at the output certain rows in P are enforced to have no compliant dynamics). This may be useful in case certain control inputs will heavily excite compliant dynamics, like aggressive substrate setpoints. For instance, for a Tx torque for an aggressive Rx substrate setpoint a similar result as in FIG. 10 can now be obtained by the measurement system of this embodiment.

Overlay and focus errors caused by internal chuck deformation due to substrate setpoints are considerably reduced by an embodiment of the invention with compliance decoupling.

As will be appreciated, any of the above described features can be used with any other feature and it is not only those combinations explicitly described which are covered in this application. In particular, although embodiments of the invention have been described above in relation to a substrate table, the present invention is applicable to any other driven object in a lithographic apparatus, including a support structure for a patterning means (e.g. a mask table), reflectors in an optical system (e.g. mirrors in the projection system of an EUV lithographic apparatus) and reticle masking blades. The present invention can be applied to a long stroke positioning system, e.g. a positioning system with a range of more than 100 mm in at least one direction, and/or to a short stroke positioning system, e.g. a positioning system with a range of less than 10 mm in at least one, and desirably all, directions.

Although specific reference may be made in this text to the use of lithographic apparatus in the manufacture of ICs, it should be understood that the lithographic apparatus described herein may have other applications in manufacturing components with microscale, or even nanoscale features, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention, at least in the form of a method of operation of an apparatus as herein described, may be practiced otherwise than as described. For example, the embodiments of the invention, at least in the form of a method of operation of an apparatus, may take the form of one or more computer programs containing one or more sequences of machine-readable instructions describing a method of operating an apparatus as discussed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing and sending signals. One or more processors are configured to communicate with at least one of the controllers. For example, each controller may include one or more processors for executing the computer programs that include machine-readable instructions for the methods of operating an apparatus as described above. The controllers may include data storage media for storing such computer programs, and/or hardware to receive such media. So the controller(s) may operate according to the machine readable instructions of one or more computer programs.

An embodiment of the invention may be applied to substrates with a width (e.g. diameter) of 300 mm or 450 mm or any other size.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid. The invention can also be applied to non-immersion lithography apparatus.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a driven object having compliant dynamics;
   a plurality of actuators configured to act on the driven object, wherein the plurality of actuators are over-determined in an actuator degree of freedom;
   a control system comprising a transformation matrix configured to generate controller output signals for each of the plurality of actuators in response to a setpoint,
   wherein the transformation matrix is configured such that the controller output signals do not excite the compliant dynamics of the driven object in at least one degree of freedom.

2. The apparatus according to claim 1, wherein the plurality of actuators are over-determined in two or more actuator degrees of freedom and the transformation matrix is configured such that the controller output signals do not excite the compliant dynamics of the driven object in a number of degrees of freedom equal to the number of actuator degrees of freedom that are over-determined.

3. The apparatus according to claim 1, wherein the plurality of actuators comprises more than six actuators configured and arranged to position the driven object in six degrees of freedom.

4. The apparatus according to claim 1, wherein the driven object has a first resonant mode, being the resonant mode of the lowest frequency amongst all its resonant modes, and the transformation matrix is configured such that the controller output signals do not excite compliant dynamics in the driven object in at least one degree of freedom having a frequency lower than half the frequency of the first resonant mode.

5. The apparatus according to claim 1, wherein the transformation matrix is configured such that the controller output signals do not excite compliant dynamics in the driven object in at least one degree of freedom having a frequency lower than a predetermined frequency.

6. The apparatus according to claim 1, wherein the transformation matrix GB satisfies the following condition:

$$S \cdot \sum_{i=7}^{N} \frac{v_i^y v_i^{u0}}{k_i} \cdot GB = 0. \qquad \text{Eq. 6}$$

where S is a selection matrix indicating the degrees of freedom in which compliant behavior is not excited, $v_i^y$ represents the displacements of the driven object due to the $i^{th}$ mode as measured by the measurement system, $v_i^{u0}$ represents the displacements of the driven object due to the $i^{th}$ mode at the physical actuators.

7. The apparatus according to claim 1, wherein the transformation matrix is further configured to enforce a diagonalized rigid body behavior of the driven object.

8. The apparatus according to claim 1, wherein the transformation matrix is further configured to reduce internal deformation of the driven object.

9. The apparatus according to claim 1, wherein the control system generates a sequence of controller output signals in response to a sequence of setpoints.

10. A substrate support system comprising
    a substrate table having compliant dynamics:
    a plurality of actuators configured to act on the substrate table, wherein the plurality of actuators are over-determined in an actuator degree of freedom;
    a control system comprising a transformation matrix configured to generate controller output signals for each of the plurality of actuators in response to a setpoint,
    wherein the transformation matrix is configured such that the controller output signals do not excite the compliant dynamics of the substrate table in at least one degree of freedom.

11. A lithographic apparatus comprising:
    a driven object having compliant dynamics;
    a plurality of actuators configured to act on the driven object;
    a plurality of sensors each configured to provide a sensor signal indicative of a position or displacement of the driven object, wherein the plurality of sensors are over-determined in a sensor degree of freedom;
    a control system comprising a transformation matrix configured to transform the sensor signals so as to not observe the effects of the compliant dynamics of the driven object in at least one degree of freedom, the control system configured to generate controller output signals for each of the plurality of actuators in response to a setpoint and the transformed sensor signals.

12. The apparatus according to claim 11, wherein the plurality of sensors are over-determined in two or more sensor degrees of freedom and the transformation matrix is configured such that the transformed sensor signals do not observe the compliant dynamics of the driven object in a number of degrees of freedom equal to the number of sensor degrees of freedom that are over-determined.

13. The apparatus according to claim 11, wherein the plurality of sensors comprises more than six sensors configured and arranged to measure the position of the driven object in six degrees of freedom.

14. The apparatus according to claim 11, wherein the driven object has a first resonant mode, being the resonant mode of the lowest frequency amongst all its resonant modes, and the transformation matrix is configured such that the transferred sensor signals do not observe compliant dynamics in the driven object in at least one degree of freedom having a frequency lower than half the frequency of the first resonant mode.

15. The apparatus according to claim 11, wherein the transformation matrix is configured such that the transferred sensor signals do not observe compliant dynamics in the driven object in at least one degree of freedom having a frequency lower than a predetermined frequency.

16. The apparatus according to claim 11, wherein the transformation matrix MS satisfies the following condition:

$$MS \cdot \sum_{i=7}^{N} \frac{v_i^{y0} v_i^{u}}{k_i} S = 0 \quad \text{Eq. 11}$$

where S is a selection matrix indicating the degrees of freedom in which compliant behavior is not observed, $v_i^{y0}$ represents the displacements of the driven object due to the $i^{th}$ mode as measured at the physical sensors, $v_i^{u}$ represents the displacements of the driven object due to the $i^{th}$ mode as defined at the controller output.

17. The apparatus according to claim 11, wherein the control system generates a sequence of controller output signals in response to a sequence of setpoints.

18. A device manufacturing method using a lithographic apparatus, the method comprising:
supporting a substrate on a substrate table having compliant dynamics and a plurality of actuators configured to act on the substrate table, wherein the plurality of actuators are over-determined in an actuator degree of freedom;
projecting a patterned beam onto the substrate to expose it to the respective pattern whilst positioning the substrate table;
wherein positioning the substrate table comprises applying a transformation matrix to a setpoint to generate controller output signals for each of the plurality of actuators, the transformation matrix being configured such that the controller output signals do not excite the compliant dynamics of the substrate table in at least one degree of freedom.

19. A device manufacturing method using a lithographic apparatus, the method comprising:
supporting a substrate on a substrate table having compliant dynamics and a plurality of actuators configured to act on the substrate table:
using a plurality of sensors to generate respective sensor signals that are indicative of a position of at least one of the substrate and the substrate table,
wherein the plurality of sensors are over-determined in a sensor degree of freedom; projecting a patterned beam onto the substrate to expose it to the respective pattern whilst positioning the substrate table; and
applying a transformation matrix to the sensor signals to generate transformed sensor signals, the transformation matrix being configured such that the transformed sensor signals do not observe the compliant dynamics of the substrate table in at least one degree of freedom.

20. A control program for a lithographic apparatus having a substrate table having compliant dynamics and a plurality of actuators configured to act on the substrate table, wherein the plurality of actuators are over-determined in an actuator degree of freedom, the program comprising code that, when executed by a computer system, instructs the computer system to: apply a transformation matrix to a setpoint to generate controller output signals for each of the plurality of actuators, the transformation matrix being configured such that the controller output signals do not excite the compliant dynamics of the substrate table in at least one degree of freedom.

21. A lithographic apparatus comprising:
an object having compliant dynamics;
a plurality of actuators configured to act on the object, wherein the plurality of actuators are over-determined in an actuator degree of freedom;
a controller comprising a transformation matrix configured to generate controller output signals for each of the plurality of actuators in response to a setpoint,
wherein the transformation matrix is configured such that the controller output signals do not excite the compliant dynamics of the object in at least one degree of freedom.

* * * * *